US010608112B2

(12) United States Patent
Zhou

(10) Patent No.: US 10,608,112 B2
(45) Date of Patent: Mar. 31, 2020

(54) FINFET DEVICE HAVING FINFET STRUCTURE AND FILLED RECESSES THAT PARTIALLY EXTEND UNDERNEATH THE FIN STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Ming Zhou, Shanghai (CN)

(73) Assignees: SEMICONDUCTOR MANUFACTURING INTERNATIONAL (BEIJING) CORPORATION, Shanghai (KR); SEMICONDUCTOR MANUFACTURING INTERNATIONAL (SHANGHAI) CORPORATION, Beijing (KR)

( * ) Notice: Subject to any disclaimer, the term of this patent is extended or adjusted under 35 U.S.C. 154(b) by 0 days.

(21) Appl. No.: 16/106,613

(22) Filed: Aug. 21, 2018

(65) Prior Publication Data
US 2018/0358461 A1 Dec. 13, 2018

Related U.S. Application Data

(62) Division of application No. 15/397,584, filed on Jan. 3, 2017, now Pat. No. 10,084,092.

(30) Foreign Application Priority Data

Mar. 30, 2016 (CN) .......................... 2016 1 0191184

(51) Int. Cl.
*H01L 29/78* (2006.01)
*H01L 21/02* (2006.01)
(Continued)

(52) U.S. Cl.
CPC ...... *H01L 29/785* (2013.01); *H01L 21/02126* (2013.01); *H01L 21/02164* (2013.01);
(Continued)

(58) Field of Classification Search
CPC ......... H01L 21/02126; H01L 21/02164; H01L 21/02203; H01L 21/3081; H01L 21/764;
(Continued)

(56) References Cited

U.S. PATENT DOCUMENTS

| 6,413,879 B1 | 7/2002 | Maeda |
| 8,143,121 B2 | 3/2012 | Lin |

(Continued)

FOREIGN PATENT DOCUMENTS

| CN | 102074572 | 5/2011 |
| CN | 102623321 | 8/2012 |

(Continued)

OTHER PUBLICATIONS

U.S. Appl. No. 15/397,584, Non-Final Office Action dated Jan. 25, 2018, 12 pages.

(Continued)

*Primary Examiner* — Stephen W Smoot
(74) *Attorney, Agent, or Firm* — Kilpatric Townsend & Stockton LLP

(57) ABSTRACT

A semiconductor device includes a semiconductor substrate and a fin structure on the semiconductor substrate. The fin structure includes a semiconductor layer, recesses in the semiconductor substrate on both sides of the fin structure and extending partially to underneath the bottom of the fin structure, and an isolation structure filling the recesses.

11 Claims, 7 Drawing Sheets

(51) Int. Cl.
  *H01L 21/308* (2006.01)
  *H01L 21/311* (2006.01)
  *H01L 21/762* (2006.01)
  *H01L 21/764* (2006.01)
  *H01L 21/8234* (2006.01)
  *H01L 29/06* (2006.01)
  *H01L 29/66* (2006.01)

(52) U.S. Cl.
  CPC .. *H01L 21/02203* (2013.01); *H01L 21/02236* (2013.01); *H01L 21/3081* (2013.01); *H01L 21/31111* (2013.01); *H01L 21/764* (2013.01); *H01L 21/76224* (2013.01); *H01L 21/823431* (2013.01); *H01L 29/0649* (2013.01); *H01L 29/6653* (2013.01); *H01L 29/66795* (2013.01); *H01L 21/823481* (2013.01)

(58) Field of Classification Search
  CPC ......... H01L 21/823431; H01L 27/0886; H01L 29/41791; H01L 29/66795; H01L 29/66818; H01L 29/785; H01L 29/7851; H01L 29/7853; H01L 29/7854
  See application file for complete search history.

(56) References Cited

U.S. PATENT DOCUMENTS

| | | | |
|---|---|---|---|
| 9,799,676 | B2 | 10/2017 | Xie et al. |
| 2011/0084340 | A1 | 4/2011 | Yuan et al. |
| 2011/0095372 | A1 | 4/2011 | Yuan et al. |
| 2012/0083107 | A1* | 4/2012 | Chang ............... H01L 21/82341 438/585 |
| 2012/0299099 | A1 | 11/2012 | Huang et al. |
| 2013/0320455 | A1 | 12/2013 | Cappellani et al. |
| 2015/0162190 | A1 | 6/2015 | Posseme |
| 2015/0371892 | A1 | 12/2015 | Xie et al. |
| 2016/0247726 | A1 | 8/2016 | Huang et al. |
| 2017/0288049 | A1 | 10/2017 | Zhou |

FOREIGN PATENT DOCUMENTS

| | | |
|---|---|---|
| CN | 102651305 | 9/2015 |
| EP | 1037275 | 9/2000 |
| WO | 2013095384 | 6/2013 |

OTHER PUBLICATIONS

U.S. Appl. No. 15/397,584, Notice of Allowance dated Jun. 6, 2018, 8 pages.
U.S. Appl. No. 15/397,584, Restriction Requirement dated Nov. 17, 2017, 7 pages.
European Patent Application No. 17162505.6, Extended European Search Report dated Jul. 31, 2017, 7 Pages.
Chinese Application No. 201610191184.3, Office Action dated Jul. 25, 2019, 10 pages.

\* cited by examiner

FINFET DEVICE HAVING FINFET STRUCTURE AND FILLED RECESSES THAT PARTIALLY EXTEND UNDERNEATH THE FIN STRUCTURE

CROSS-REFERENCES TO RELATED APPLICATIONS

This application is a divisional of U.S. patent application Ser. No. 15/397,584, filed on Jan. 3, 2017, now U.S. Pat. No. 10,084,092, which claims priority to Chinese Patent Application No. 201610191184.3, filed on Mar. 30, 2016, the content of which is incorporated herein by reference in its entirety.

BACKGROUND OF THE INVENTION

The present invention relates to the field of semiconductor technology. Specifically, embodiments of the invention relate to fin type device structures and manufacturing methods.

FIG. 1 is a cross-sectional view illustrating a conventional fin type device (e.g., the FinFET device). The device includes a substrate 102 and a fin structure on the substrate. The fin structure includes a semiconductor layer 104 and a hard mask layer 106 overlying the semiconductor layer. In this conventional structure, the fin structures are separated by an isolation layer 108. Since the insulating layer 108 exists only between parts of the semiconductor layer 104 of the fin, there is no effective isolation in the substrate 102 below the fin structures. As a result, this structure can be susceptible to the problem of leakage current.

The above problems are more pronounced in the bulk semiconductor substrate process. Regarding the DC characteristics of the semiconductor device, devices based on the SOI (Silicon-On-Insulator) substrate and bulk silicon FinFET device of similar device sizes can provide similar on/off current ratio. However, regarding PN junction leakage current and parasitic capacitance of the devices, the difference becomes significant.

BRIEF SUMMARY OF THE INVENTION

According to some embodiments of the invention, a method of forming a semiconductor device includes providing a substrate structure having a semiconductor substrate and a fin structure on the semiconductor substrate. The fin structure includes a semiconductor layer and a hard mask layer on top of the semiconductor layer. The method also includes forming a spacer layer on sidewalls of the fin structure. Next, using the hard mask layer and the spacer layer as a mask, the semiconductor substrate is etched to form recesses on both sides of the fin structure that extend partially to underneath the bottom of the fin structure. The method further includes forming a filler material to fill at least the recesses, thereby forming the first filler layer.

In an embodiment of the above method, the filler material includes an organic silicon compound, and the method also includes curing the first filler layer to form a cured second filler layer. The second filler layer is oxidized to form a porous silicon oxide material.

In another embodiment, the method also includes oxidizing the portion of the semiconductor substrate underneath the fin structure and between the recesses.

In another embodiment, the first filler layer may include voids.

In another embodiment, the organic silicon compound comprises SiOCH (organosilicate).

In another embodiment, the second filler layer has a porosity of 15% to 70%

In another embodiment, oxidizing the second filler layer includes using wet oxidation and/or dry oxidation.

In another embodiment, the method also includes etching the porous silicon oxide material to expose at least a portion of the spacer layer, and removing the spacer layer to expose a portion of the fin structure.

In another embodiment, etching the semiconductor substrate to form recesses includes using an isotropic etching process.

In another embodiment, etching the semiconductor substrate to form recesses comprises using a crystalline orientation selective wet etching process.

In another embodiment, forming a spacer layer on sidewalls of the fin structure includes forming a spacer material layer overlying the fin structure, and removing the spacer material layer from the top of the fin structure and the silicon substrate to form the spacer layer on sidewalls of the fin structure.

In another embodiment, the semiconductor substrate also includes an additional semiconductor layer adjacent to the semiconductor substrate, and the recesses are formed in the additional semiconductor layer.

According to some embodiments of the invention, a semiconductor device includes a semiconductor substrate and a fin structure on the semiconductor substrate. The fin structure includes a semiconductor layer. The semiconductor device also includes recesses in the semiconductor substrate on both sides of the fin structure and extending partially to underneath the bottom of the fin structure. The semiconductor device also includes an isolation structure filling the recesses.

In an embodiment of the above device, the isolation structure comprises a porous silicon oxide material.

In another embodiment, the isolation structure includes a low K dielectric material.

In another embodiment, the porosity of the isolation structure is between 15% to 70%.

In another embodiment, the semiconductor substrate also includes an additional semiconductor layer adjacent to the semiconductor substrate, and the recesses are formed in the additional semiconductor layer.

In another embodiment, the device also includes a silicon oxide material under the fin structure and between the recesses.

In another embodiment, the device also has a hard mask layer on the semiconductor material of the fin structure.

The following description, together with the accompanying drawings, will provide further understanding of the nature and advantages of the claimed invention.

DETAILED DESCRIPTION OF THE INVENTION

Figure 1:
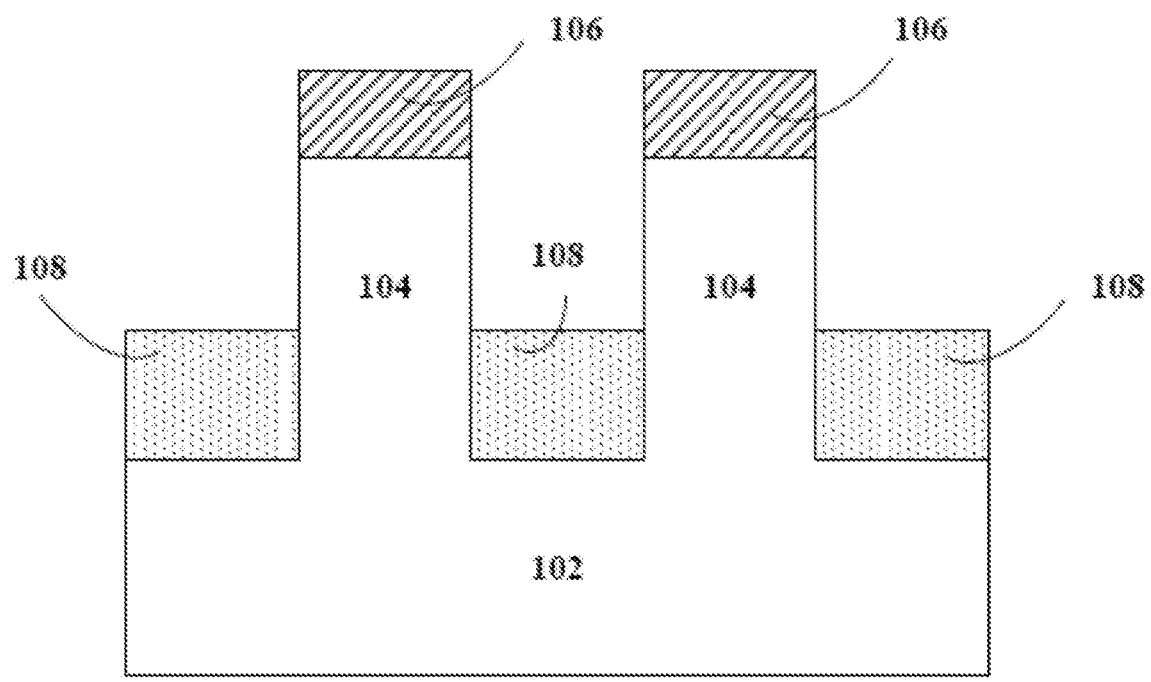
FIG. 1 is a cross-sectional view illustrating a conventional fin type device (e.g., the FinFET device)

The drawings of various exemplary embodiments of the present invention will be described in detail. It should be noted that, unless otherwise specified, the relative arrangement set forth in these embodiments, components and steps, the numerical expressions, and values do not limit the scope of the present invention. At the same time, it should be appreciated that, for ease of description, the dimensions of the various parts are not illustrated in the drawings according to the actual proportional relationship.

The following description of exemplary embodiments is merely illustrative of the present invention and in no way presents any restrictions on its use or application. Techniques, methods, and equipment known to someone of ordinary skill in the relevant art may not be discussed in detail, but in appropriate cases, the techniques, methods and equipment should be considered as part of the specification.

In all the examples shown and discussed, any specific value is to be construed as merely illustrative, and not as a limitation. Accordingly, another exemplary embodiment may have different values. It should be also noted that like reference numerals and letters refer to similar items in the following figures, and thus once an item is defined in one figure, it need not be further discussed in subsequent figures.

Figure 2:
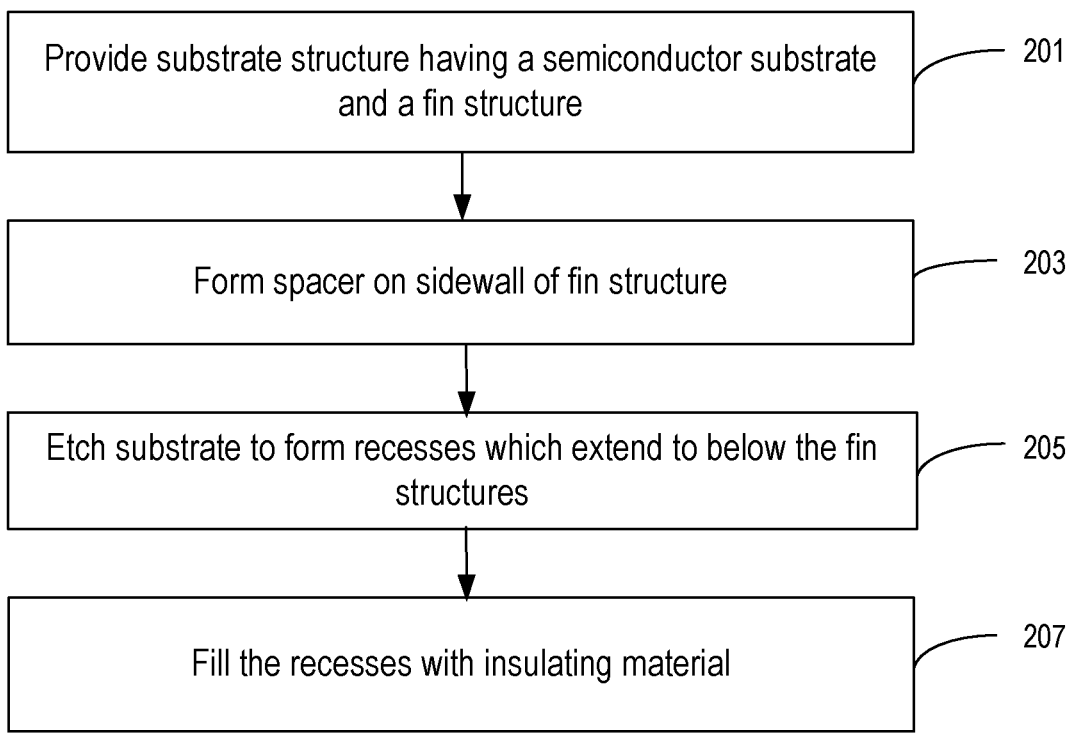
FIG. 2 is a simplified flow chart illustrating a method of manufacturing a semiconductor device according to an embodiment of the invention.

FIG. 2 is a simplified flow chart illustrating a method of manufacturing a semiconductor device according to an embodiment of the invention. FIGS. 3-11 are simplified cross-sectional view diagrams illustrating a number of stages of the manufacturing process of a semiconductor device according to an embodiment of the invention.

As shown in FIG. 2, the method of forming a semiconductor device includes, at step 201, providing a substrate structure having a semiconductor substrate and a fin structure on the semiconductor substrate. The fin structure includes a semiconductor layer and a hard mask layer on top of the semiconductor layer. At step 203, the method also includes forming a spacer layer on sidewalls of the fin structure. Next, at step 205, using the hard mask layer and the spacer layer as a mask, the semiconductor substrate is etched to form recesses on both sides of the fin structure that extend partially to underneath the bottom of the fin structure. At step 207, a filler material is formed to fill at least the recesses, thereby forming the first filler layer.

Figure 3:
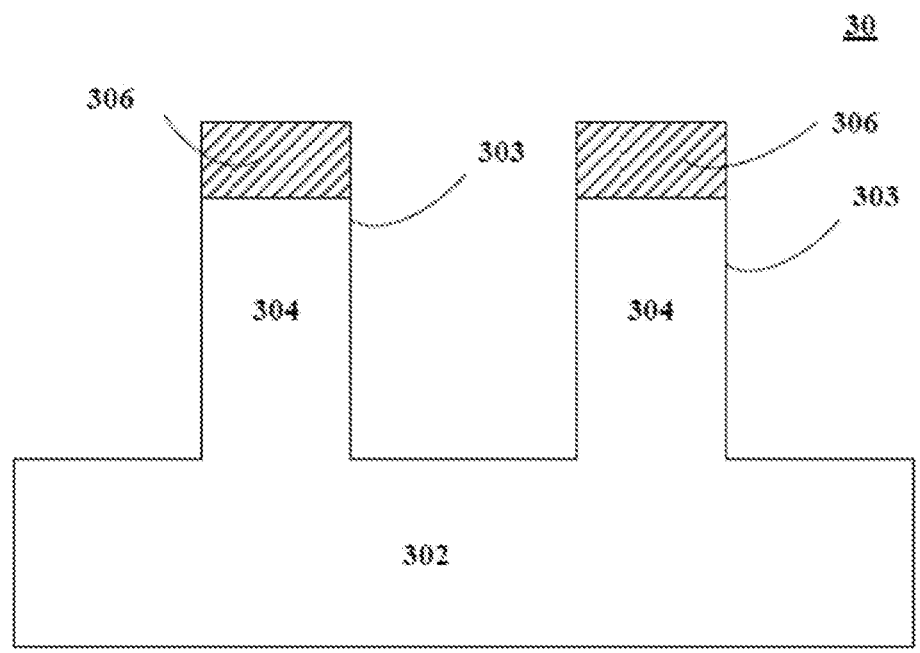
FIGS. 3-11 are simplified cross-sectional view diagrams illustrating a number of stages of the manufacturing process of a semiconductor device according to an embodiment of the invention.

The method is further described in FIGS. 3-11, which are simplified cross-sectional view diagrams illustrating a number of stages of the manufacturing process of a semiconductor device according to an embodiment of the invention. As shown in FIG. 3, a substrate structure 30 has a semiconductor substrate 302 and a fin structure 303 on the semiconductor substrate. Fin structure 303 includes a semiconductor layer 304 and a hard mask layer 306 on top of the semiconductor layer. Substrate 302 may be a semiconductor substrate, for example, a bulk silicon substrate. In some embodiments, substrate 302 can be a semiconductor material that is different from semiconductor layer 304 of the fin structure. For example, substrate 302 can be a silicon substrate, and semiconductor layer 304 of the fin structure can include germanium or silicon germanium. Hard mask layer 306 may be a silicon nitride, or other suitable masking material. Substrate structure 30 can be formed using known processes that will not be described in detail.

Figure 4:
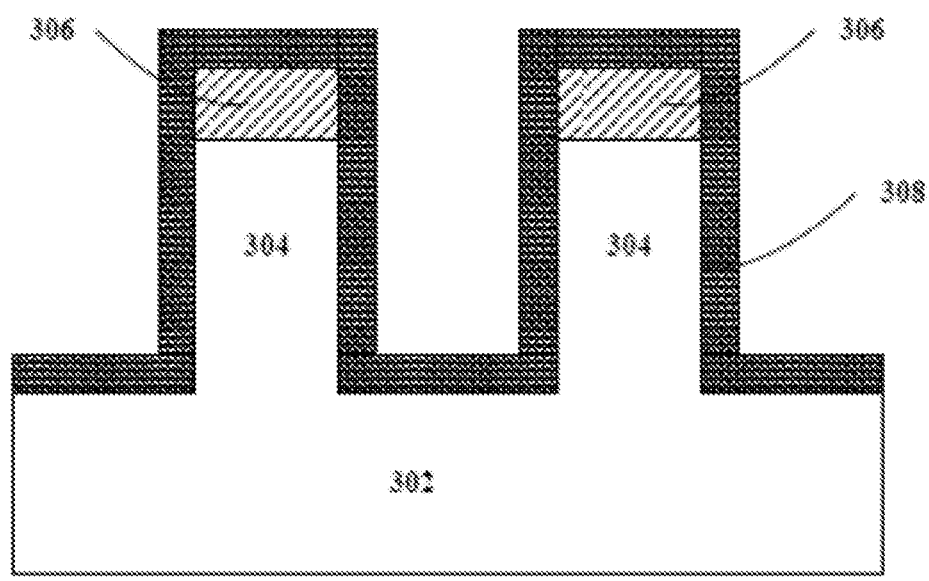
Figure 5:
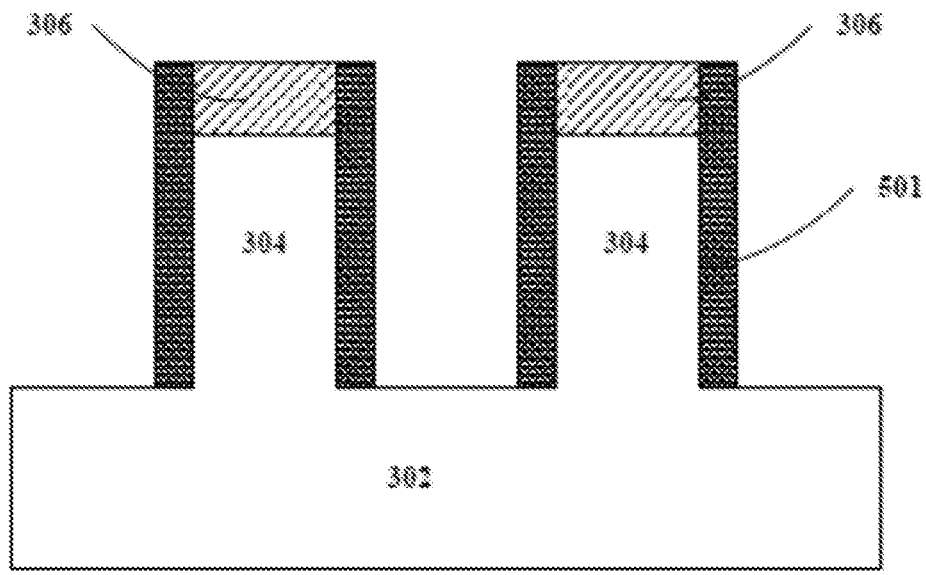

In FIG. 4, an insulation material layer 308 is formed on fin structures 303 and substrate 302. As shown in FIG. 5, insulation material layer 308 is etched to form spacers 501. Spacers 501 may be formed with silicon oxides or silicon nitrides, etc.

Figure 6:
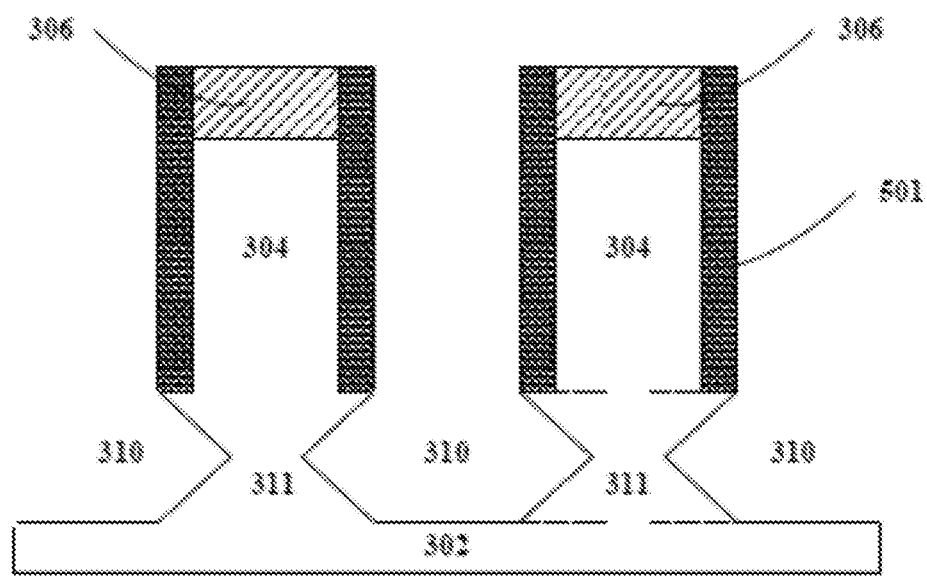

In FIG. 6, substrate 302 is etched using hard mask layer 306 and spacers 501 as a mask to form recesses 310 in substrate 302. It can be seen that portions of recesses 310 extend to under fin structures 303. The remaining portions of substrate 302 underneath fins 304 are labeled 311.

In an embodiment, etching of the substrate 302 may be achieved using a crystalline orientation selective etching process. For example, tetramethylammonium hydroxide (Tetramethyl ammonium hydroxide, referred to as TMAH) solution may be used to etch substrate 302 from recesses 310. Although the recesses formed in FIG. 6 are shown having Σ-shaped edges, it should be understood that it is only an example, as the present invention is not limited in concave shape. For example, an isotropic wet etch process can be used to etch substrate 302 to form recesses 501.

In step 207 in FIG. 2, an insulating filler material is formed to fill recesses 310 to form a first filler layer 312. The insulating filler can be selected oxides of silicon, silicon-containing organic compounds, and other low-k dielectric materials, etc. As used here, a low-k dielectric material refers to a material having a dielectric constant of less than or equal to 3.0. Thus, a novel isolation structure for the fin device can be realized, providing good support, good mechanical strength, good electrical properties and stability.

Figure 7:
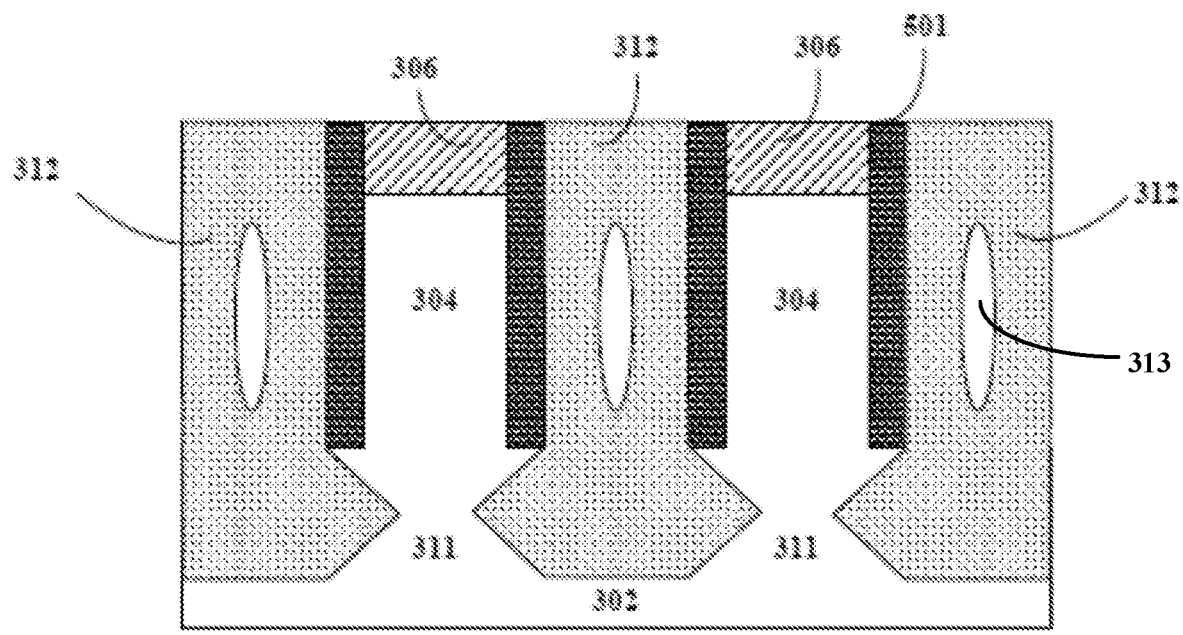

In some embodiments, a silicon-containing organic compound is used to fill recesses 310 to form the first filler layer 312. The organic silicon compound includes, but is not limited to, SiOCH. The first filler layer 312 fills at least recesses 310, and first filler layer 312 may be formed to be substantially flush with the top of hardmask layer 306, or may be formed so as to cover hard mask layer 306. When the first filler layer 312 covers hardmask layer 306, the portions of the cover may be etched away. First filler layer 312 may be formed using a plasma-enhanced chemical vapor deposition (PECVD) process or a spin coating process. As shown in FIG. 7, first filler layer 312 may have voids 313.

Figure 8:
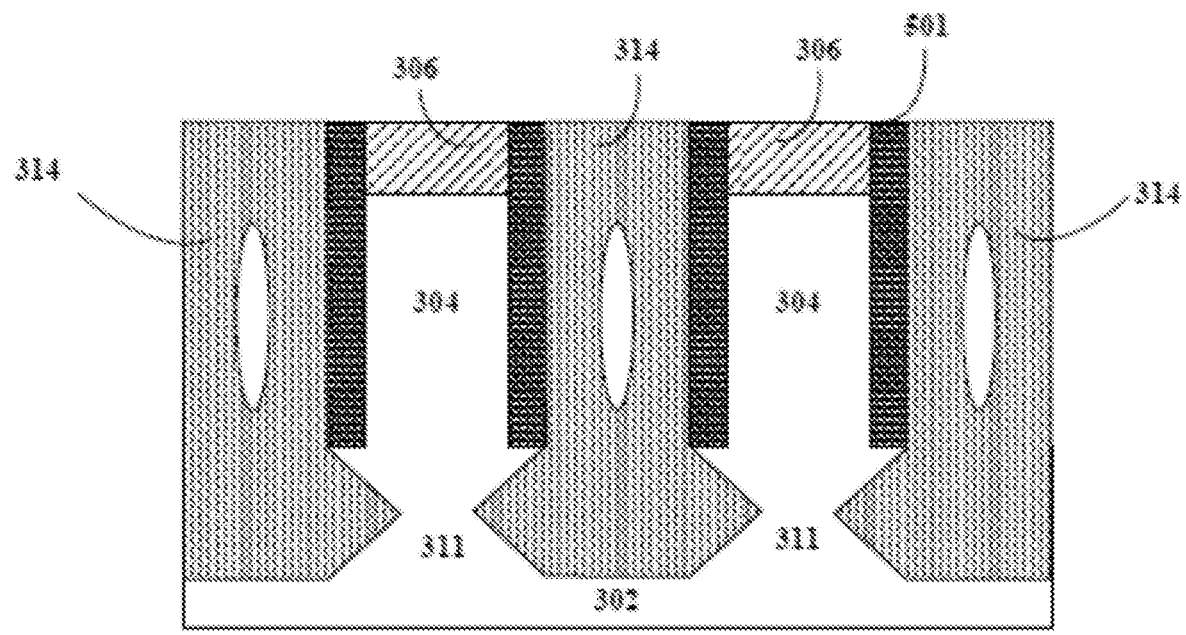

Next, the method includes curing first filler layer 312 to form a cured second filler layer 314, as shown in FIG. 8. For example, the first filler layer 312 with SiOCH material may be cured by a UV curing process to obtain a second filler layer 314 of porous SiOCH material. Because of its porosity, the equivalent dielectric constant is reduced further. In one implementation, the porosity of the second layer with ultraviolet-curing treatment can be 15% to 70%, so that the isolation structure can have low permittivity, high mechanical strength, excellent electrical properties and thermal stability.

Figure 9:
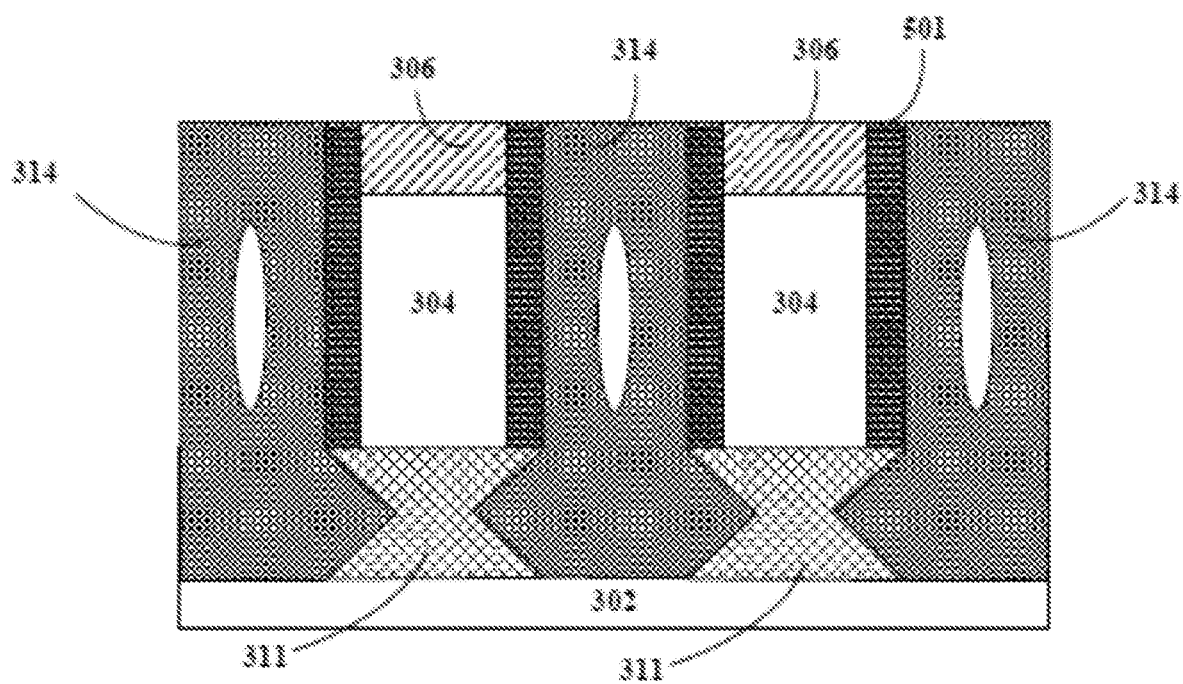

In certain embodiments, as shown in FIG. 9, the material in second filler layer 314 can be oxidized to form a silicon oxide layer. The second filler material 314 may be a porous silicon oxide layer. Further, the remaining portions 311 in the substrate under fin structures 303 can also be oxidized.

In one embodiment, the porous silicon oxide layer can be formed using wet oxidation and/or dry oxidation processes. The remaining portions 311 of the substrate may be partially oxidized or fully oxidized. The resulting isolation structure may have a low dielectric constant and good mechanical strength, so that the device has good electrical properties and thermal stability, thereby reducing the leakage current.

Figure 10:
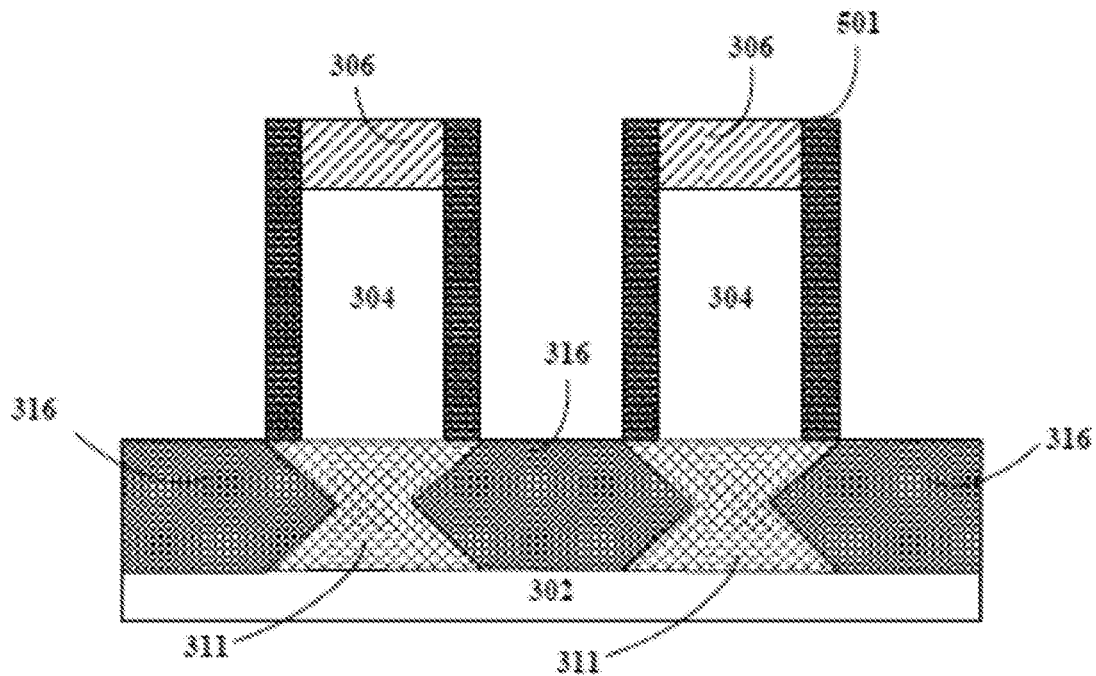

Subsequently, in some embodiments, as shown in FIG. 10, second filler layer 314 can be etched, thereby forming the isolation structure 316 in the recessed regions 310.

In another embodiment, the second filler layer 314 of FIG. 8 is etched back before it is oxidized. For example, second filler layer 314 can be etched back using, e.g., dilute aqueous hydrofluoric acid, thereby removing a portion of second filler layer 314, so that at least a portion of the spacer layer 501 at the side walls of fin 313 is exposed. After that, a wet oxidation and/or dry oxidation process can be used to oxidize the porous filler layer 314 and the recesses substrate 311. Here, the recessed portion 311 may be partially oxidized to silicon oxides, or fully oxidized to silicon oxides. Finally, the exposed barrier or spacer layer 501 may be removed to expose at least a portion of the fin, resulting in the structure shown in FIG. 11. According to an embodiment of the present invention, the dielectric constant of isolation structure 316 (or equivalent dielectric constant) is low. The device can be well isolated with good mechanical strength. The device can also have excellent stability and electrical characteristics (e.g., thermal stability, etc.), and the leakage current can be reduced.

Figure 11:
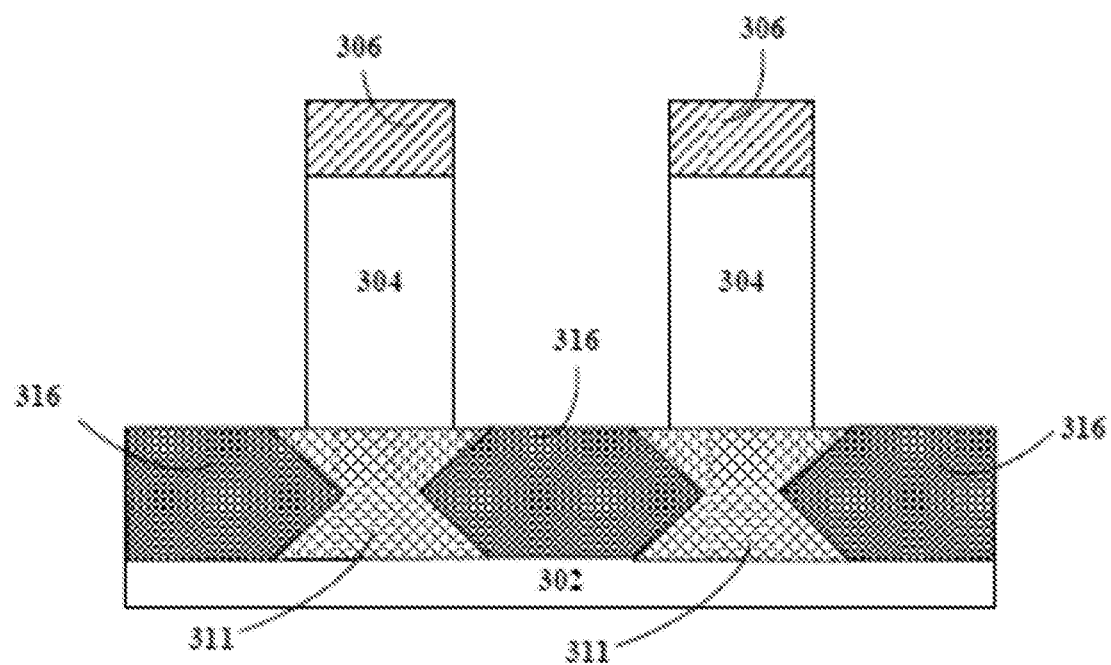

In alternative embodiments, embodiments of the present invention also provide a semiconductor device as shown in FIG. 11. The semiconductor device includes a semiconductor substrate and a fin structure on the semiconductor substrate. The fin structure includes a semiconductor layer. The semiconductor device also includes recesses in the semiconductor substrate on both sides of the fin structure and extending partially to underneath the bottom of the fin structure. The semiconductor device also includes an isolation structure filling the recesses.

In an embodiment of the above device, the isolation structure comprises a porous silicon oxide material.

In another embodiment, the isolation structure includes a low K dielectric material.

In another embodiment, the porosity of the isolation structure is between 15% to 70%.

In another embodiment, the semiconductor substrate also includes an additional semiconductor layer adjacent to the semiconductor substrate, and the recesses are formed in the additional semiconductor layer.

In another embodiment, the device also includes a silicon oxide material under the fin structure and between the recesses.

In another embodiment, the device also has a hard mask layer on the semiconductor material of the fin structure.

Thus, a semiconductor device structure and a manufacturing method of a semiconductor device have been described in detail. While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications. Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device, comprising:
    a semiconductor substrate and a fin structure on the semiconductor substrate, said fin structure including a semiconductor layer;
    recesses in the semiconductor substrate on both sides of the fin structure, and extending partially to underneath a bottom of the fin structure; and
    an isolation structure filling the recesses; and
    a surface portion of the semiconductor substrate below the fin structure comprising a silicon oxide material having a width greater than a width of the bottom of the fin structure.

2. The device of claim 1, wherein the isolation structure comprises a porous silicon oxide material.

3. The device of claim 1, wherein the isolation structure comprises a low K dielectric material.

4. The device of claim 1, wherein a porosity of the isolation structure is between 15% to 70%.

5. The device of claim 1, wherein the semiconductor substrate further comprises an additional semiconductor layer adjacent to the semiconductor substrate, and the recesses are formed in the additional semiconductor layer.

6. The device of claim 1, further comprising a silicon oxide material under the fin structure and between the recesses.

7. The device of claim 1, further comprising a hard mask layer on the semiconductor layer of the fin structure.

8. The device of claim 7, further comprising a spacer disposed on sidewalls of the hard mask layer and sidewalls of the semiconductor layer.

9. The device of claim 8, wherein the semiconductor substrate comprises an oxidized portion underneath the semiconductor layer and the spacer, the oxidized portion is characterized by an electrical property different from an electrical property of the semiconductor substrate.

10. The device of claim 8, wherein the spacer has an upper surface coplanar with an upper surface of the hard mask layer.

11. The device of claim 8, wherein the spacer comprises silicon oxide or silicon nitride.

* * * * *